United States Patent
Hoefler et al.

(10) Patent No.: US 10,446,225 B1
(45) Date of Patent: Oct. 15, 2019

(54) MEMORY SYSTEM HAVING A SOURCE BIAS CIRCUIT

(71) Applicant: NXP USA, INC., Austin, TX (US)

(72) Inventors: Alexander Hoefler, Austin, TX (US); Nihaar N. Mahatme, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/966,390

(22) Filed: Apr. 30, 2018

(51) Int. Cl.
*G11C 11/00* (2006.01)
*G11C 11/417* (2006.01)
*G11C 11/412* (2006.01)

(52) U.S. Cl.
CPC .......... *G11C 11/417* (2013.01); *G11C 11/412* (2013.01)

(58) Field of Classification Search
CPC ............................. G11C 11/417; G11C 11/412
USPC .......................................................... 365/156
See application file for complete search history.

(56) References Cited

U.S. PATENT DOCUMENTS

| | | | |
|---|---|---|---|
| 6,744,659 B1 | 6/2004 | Eby et al. | |
| 7,265,605 B1* | 9/2007 | Vasudevan | G05F 1/56 327/534 |
| 7,688,669 B2 | 3/2010 | McClure et al. | |
| 7,691,702 B2* | 4/2010 | Kapoor | G11C 11/4023 257/E21.645 |
| 7,768,842 B2 | 8/2010 | Hur et al. | |
| 9,135,977 B2* | 9/2015 | Kapoor | G11C 11/4023 |
| 9,147,459 B2* | 9/2015 | Kapoor | G11C 11/4023 |
| 9,747,986 B2* | 8/2017 | Tran | G06F 17/5081 |
| 2008/0233685 A1* | 9/2008 | Kapoor | G11C 11/4023 438/129 |

OTHER PUBLICATIONS

Clark, Lawrence T., et al., "Reverse-Body Bias and Supply Collapse for Low Effective Standby Power;" IEEE Transactions on Very Large Scale Integration (VLSI) Systems; vol. 12, Issue 9, Sep. 2004; pp. 947-956; DOI: 10.1109/TVLSI.2004.832930.

* cited by examiner

*Primary Examiner* — Harry W Byrne

(57) ABSTRACT

A memory system includes an isolated first well of a first polarity and an array of volatile memory cells. Each of the memory cells includes a first set of transistors in the isolated first well, and a second set of transistors. A source bias circuit is coupled to the array of volatile memory cells. At least a portion of the source bias circuit is in the isolated first well and coupled to source electrodes of the first set of transistors of each of the memory cells. A control circuit is configured to enable the source bias circuit.

19 Claims, 3 Drawing Sheets

MEMORY SYSTEM HAVING A SOURCE BIAS CIRCUIT

BACKGROUND

Field

This disclosure relates generally to memory systems, and more specifically, to a memory system having a source bias circuit.

Related Art

It is desirable to reduce leakage currents in memories during standby in order to conserve power and achieve improved data retention. Even when a memory is in a "standby" or "off" state, each device in the memory array which is "off" exhibits leakage current. Although this leakage current is small, for a large memory array, the total leakage current can add up to a more significant amount, contributing more significantly to power loss, which is especially problematic in battery operated devices, such as hand-held mobile devices.

Leakage reduction in memory arrays can be achieved by techniques such as applying a reverse body bias (RBB) to the well connection of the memory array transistors (e.g. of the pulldown and passgate N-type Metal-Oxide-Semiconductor (NMOS) devices located in an isolated p-well). Further leakage reduction can be achieved by applying source biasing to the array devices (e.g. to the pulldown and pullup devices of a memory cell). This is achieved using a diode-connected Metal-Oxide-Semiconductor Field Effect Transistor (MOSFET) outside of the isolated well of the memory array, connected between the sources of the array devices and ground. However, the combination of these techniques leads to diminished return of the source biasing. That is, because the reverse body bias reduces the leakage of the array, the load on the diode-connected MOSFET is also reduced, which in turn reduces the source bias voltage, causing a degradation of the leakage reduction. Therefore, a need exists for an improved source bias when the memory array is reverse body biased.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

To reduce leakage currents in a memory system, such as in a static random access memory (SRAM) system, in which a RBB is applied to the array devices of the memory array of the memory system, a source bias circuit is applied which tracks the leakage current reduction due to the RBB to ensure that the effectiveness of the source bias in not degraded by the RBB. In one embodiment, a source bias circuit includes a diode-connected MOSFET (i.e. transistor) which physically connects the well of the diode to the well of the memory array. This may be achieved by placing the diode-connected MOSFET into the well of the array where the RBB is enabled such that the diode tracks the well bias condition. In this manner, when RBB is applied, it is applied to both the memory devices of the memory array and to the diode. As a result, during source biasing under an RBB condition, the load on the diode gets reduced, but the threshold voltage of the diode also gets pushed higher such that it becomes a weaker clamp. Therefore, the source bias voltage applied by the source bias circuit does not get degraded and the effectiveness of source biasing on leakage reduction is retained. In one embodiment, the diode-connected MOSFET for the source bias circuit may be provided by a modified tracking cell within the well of the array.

Figure 1:
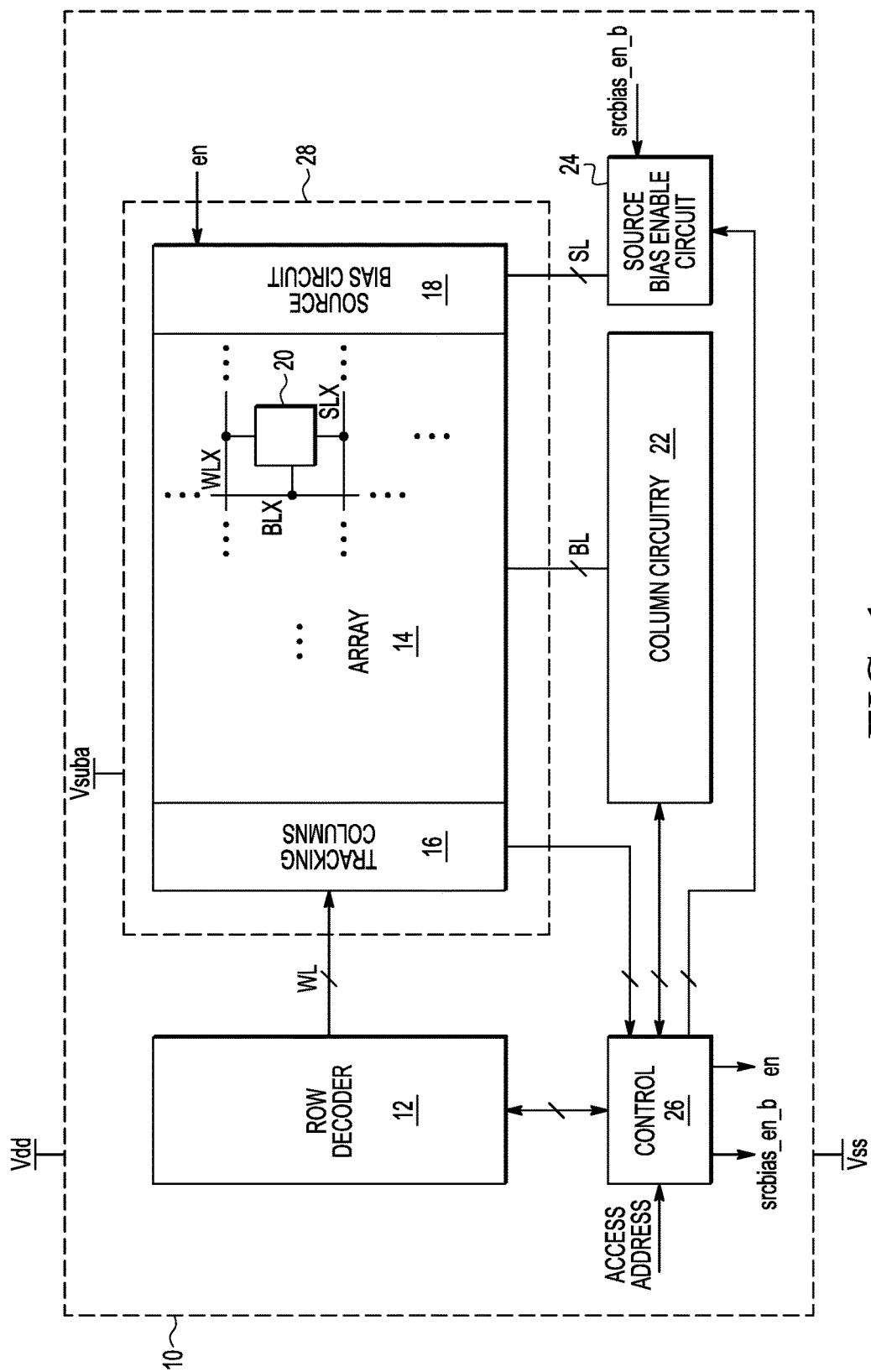
FIG. 1 illustrates, in block diagram form, a memory system in accordance with one embodiment of the present invention.

FIG. 1 illustrates a memory system 10 including a row decoder 12, array 14, tracking columns 16, a source bias circuit 18, column circuitry 22, a source bias enable circuit 24 and a control circuit 26. Array 14, tracking columns 16, and source bias circuit 18 all reside in an isolated well 28. In one embodiment, the isolated well 28 is a p-well. Row decoder 12, control circuit 26, column circuitry 22, and source bias enable circuit 24 are all located outside of the isolated p-well. Tracking columns 16 and source bias circuit 18, which are located in the same isolated well as array 14, may be considered to be part of array 14. Row decoder 12 is coupled to array 14 via a plurality of word lines (WL) and is also bidirectionally coupled to control circuit 26. Array 14 is coupled to column circuitry 22 by way of a plurality of bit lines (BL). Array circuity 14 includes a plurality of bitcells, such as, for example, bitcell 20, with a bitcell located at the intersection of each word line and bit line. Column circuitry 22 includes column decoding circuitry as well as sense amplifiers coupled to each BL. Source bias circuit 18 is coupled to the source lines of the bitcells in array 14 and is coupled to source bias enable circuit 24. Source bias circuit 18 receives an enable signal, en. Tracking columns 16 and source bias enable circuit 24 are each coupled to control circuit 26. Source bias enable circuit 24 receives a source bias enable signal, srcbias_en_b.

In the illustrated embodiment, memory system 10 is coupled to a first power supply voltage terminal, e.g. a terminal which provides VDD, and a second power supply voltage terminal, e.g. a terminal which provides VSS. VDD is greater than VSS, and VSS may be ground or 0V. Isolated well 28 is coupled to a second power supply voltage terminal, e.g., a terminal which provides Vsuba. In the illustrated embodiment, Vsuba is a negative well bias or an RBB. Therefore, note that the body terminals of transistors within isolated well 28 receive Vsuba (a negative well bias or a voltage below 0V) rather than VSS. The body terminal of those transistors located outside of isolated well 28 receive VSS. As used herein, the first, second, and third power supply voltage terminals may simply be referred to as VDD, VSS, and Vsuba, respectively.

In operation, control circuit 26 provides the en signal and the srcbiasen_b signal. Control circuit 26 receives the access address, and provides a first portion of the access address to row decoder 12 so that row decoder 12 can activate a selected word line as indicated by the first portion for a particular memory operation. Control circuit 26 provides a second portion of the access address to columns circuit 22 which activates selected bit lines for a particular memory operation. Control signals provided with the access address to control 26 can be used to indicate the type of memory operation, such as a read or write operation. Control circuit 26 also provides control signals to row decoder 12 and column circuitry 22 to control the memory operations. Tracking columns 16 provides a control signal to control circuit 26 to enable self-timing of memory operations. Note that control circuit 26, row decoder 12, column circuitry 22, with respect to read and write memory operations, operate as known in the art. However, as will be described below, during standby, source bias circuit 18 and source bias enable circuit 24 allow for improved source biasing and thus reduced leakage current.

Figure 2:
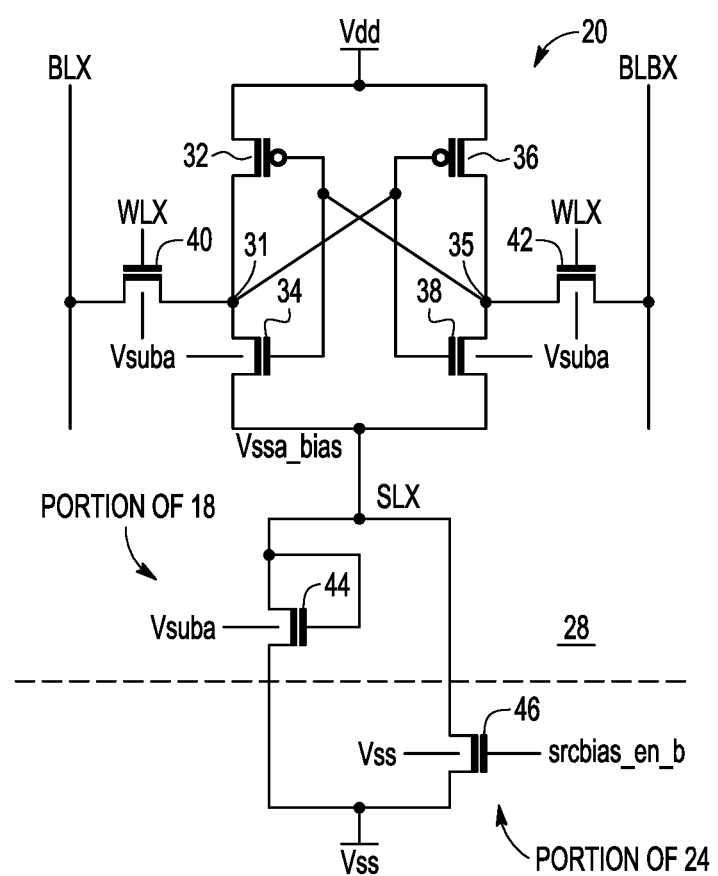
FIG. 2 illustrates, in schematic form, a portion of the memory system of FIG. 1, including a memory cell of the memory array, a portion of a source bias circuit, and a portion of a source bias enable circuit, in accordance with one embodiment of the present invention.

FIG. 2 illustrates, in schematic form, a portion of isolated well 28, bitcell 20, a portion of source bias tracking circuit 18, and a portion of source bias enable circuit 24. Bitcell 20 includes NMOS transistors 34, 38, 40, and 42, and PMOS transistors 32 and 36. Bitcell 20 is coupled to a bit line, BLX, of the plurality of bit lines of array 14, and a complementary bit line, BLB, of BLX, referred to as BLBX. Bitcell 20 is also coupled to a word line, WLX, of the plurality of word lines of array 14. Bitcell 20 is also coupled to a source line, SLX, of the plurality of source lines of array 14 in which each row of bitcells may be coupled to a same source line. SLX extends to source bias circuit 18, in which the illustrated portion of source bias circuit 18 includes an NMOS transistor 44. The illustrated portion of source bias enable circuit 24 includes an NMOS transistor 46.

Referring to bitcell 20, a first current electrode of transistor 40 is coupled to BLX, and a control electrode coupled to WLX, and a second current electrode coupled to a circuit node 31. A first current electrode of transistor 32 is coupled to VDD, and a second current electrode is coupled to node 31. A first current electrode of transistor 34 is coupled to node 31, and a second current electrode of transistor 34 is coupled to source line, SLX. A control electrode of transistor 32 is coupled to a control electrode of transistor 34 and to a circuit node 35. A first current electrode of transistor 36 is coupled to VDD, a second current electrode is coupled to node 35, and a control electrode is coupled to node 31. A first current electrode of transistor 38 is coupled to node 35, a second current electrode is coupled to SLX, and a control electrode is coupled to the control electrode of transistor 36. A first current electrode of transistor 42 is coupled to node 35, a control electrode of transistor 42 is coupled to WLX, and a second current electrode of transistor 42 is coupled to BLBX.

Bitcell 20 is an example of a 6T SRAM bitcell. In bitcell 20, transistors 32, 24, 36, and 38 operate as a cross-coupled pair of inverters which latch (i.e. store) a bitcell memory state of a logic 1 or a logic 0. Read and write operations can be performed on bitcell 20 as known in the art. For example, to access bitcell 20 for a read or a write operation, row decoder 12 activates WLX, which turns on transistors 40 and 42, referred to as pass transistors. For a read access, sense amplifiers in column circuitry 22 sense the voltage levels on BLX and BLBX to determine the stored state. For a write access, column circuitry provides the appropriate voltages to BLX and BLBX to store a desired state, as indicated by write data (not illustrated) provided by control circuit 26 to column circuit 22. As will be explained below, during read or write operations, the sources of transistors 34 and 38 (i.e. the second current electrodes of transistors 34 and 38) are coupled to VSS. In alternate embodiments, bitcell 20 may have other configurations and a different number of transistors. In the illustrated embodiment, transistors 32, 34, 36, and 38 are located in isolated well 28.

Still referring to FIG. 2, a first current electrode and a control electrode of transistor 44 are coupled to SLX, and a second current electrode of transistor 44 is coupled to VSS. Note that transistor 44 is a diode-connected transistor and therefore may also be referred to as diode 44. Diode 44 is a part source bias circuit 18, in which source bias circuit 18 includes a similar diodes for each source line in array 14. Transistor 46 is part of source bias enabled circuit 24. A first current electrode of transistor 46 is coupled to SLX, and second current electrode of transistor 46 is coupled to VSS, and a control electrode of transistor 46 is coupled to receive srcbias_en_b. Since transistors 40, 42, and 44 are located in isolated well 28, their body terminals are coupled to Vsuba. In one embodiment, body ties may be used to couple the body terminals of transistors 40, 42, and 44 to the substrate supply voltage of well 28 provided by Vsuba. However, the body terminal of transistor 46, located outside of well 28, is not coupled to Vsuba but is instead coupled to VSS (the substrate supply voltage of system 10 outside of well 28).

In one embodiment, transistors 32 and 36 are located in wells within isolated well 28 which are of an opposite polarity as isolated well 28. In this case, body terminals of transistors 32 and 36 may be coupled to Vdd. In an alternate embodiment, transistors 32 and 36 are located directly within isolated well 28 or within wells in isolated well 28 which are of the same polarity as isolated well 28. In these cases, body terminals of transistors 32 and 36 may be coupled to Vsuba.

In operation, the srcbias_en_b signal controls transistor 46 which is in parallel with diode 44. The srcbias_en_b is active low (set to "0" when asserted and "1" when negated). Therefore, during normal operation, such as during read and write operations, srcbias_en_b is negated to a logic level 1, thus turning on transistor 46 which shorts diode 44. In this manner, during normal operation, diode 44 does not provide any source bias to SLX, and SLX is coupled to VSS via transistor 46. However, during standby mode (or off mode) in which transistors 32, 34, 36, and 38 are in an off or non-conducting state, srcbias_en_b is asserted to a logic level 0,which turns off transistor 46. This places array 14 into a source bias mode in which leakage current is reduced. In this case, diode 44 provides a source bias voltage, vssa_bias, to SLX. Note that the RBB does not change the diode characteristics of diode 44. That is, since diode 44 is formed within well 28 as with the rest of the array transistors, when the array receives RBB the body of diode 44 does too. In this manner, diode 44, which provides the source bias voltage, tracks the well bias condition being applied to the transistors of array 14 within well 28. In this case, the source bias voltage is roughly independent of the RBB. By having diode 44 track the well bias condition, the effect of the RBB on leakage current reduction is not degraded.

Figure 3:
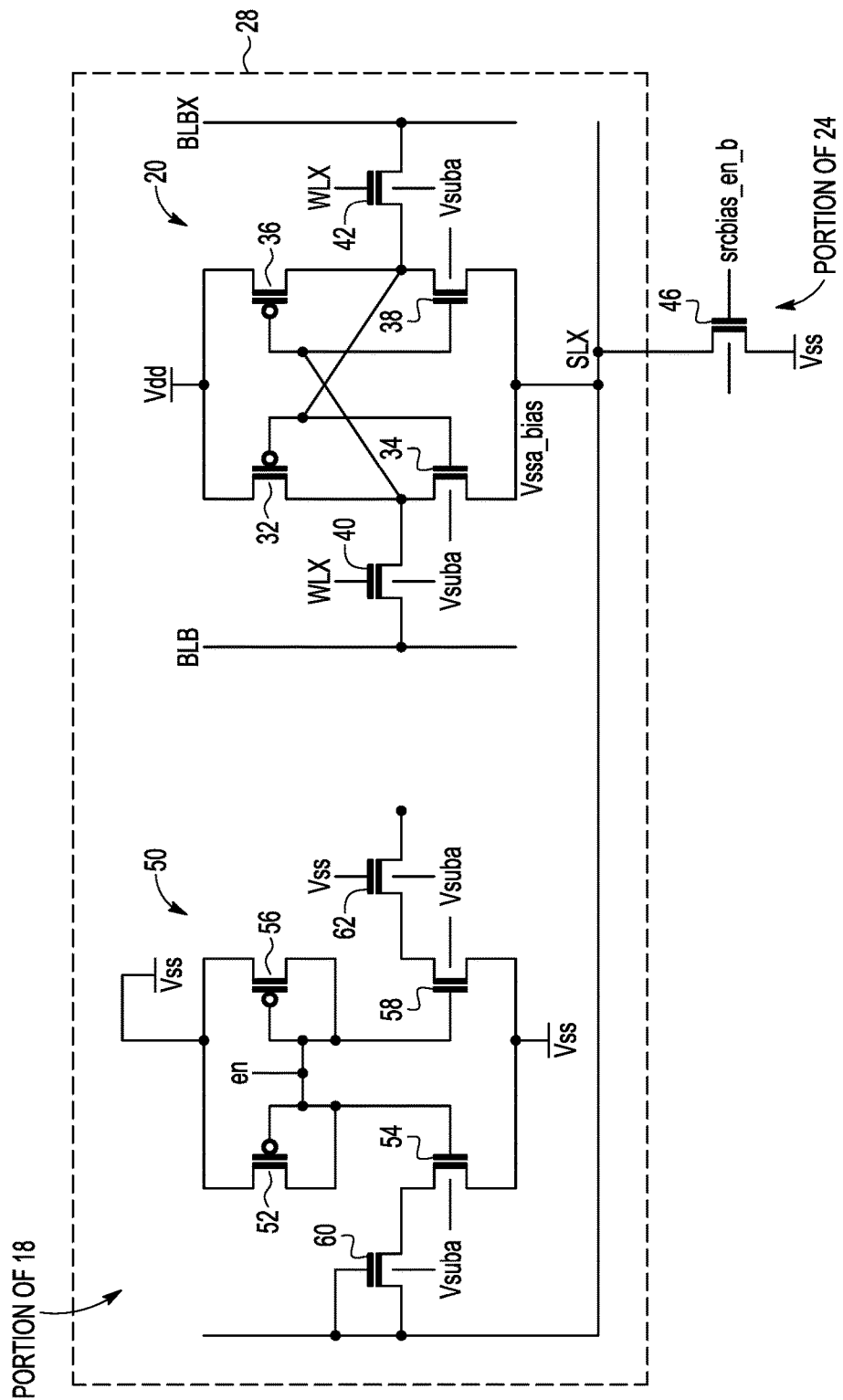
FIG. 3 illustrates, in schematic form, a portion of the memory system of FIG. 1, including a memory cell of the memory array, a portion of a source bias circuit, and a portion of a source bias enable circuit, in accordance with one embodiment of the present invention.

FIG. 3 illustrates, in schematic form, a portion of isolated well 28, bitcell 20, a portion of source bias tracking circuit 18, and a portion of source bias enable circuit 24. Note that like numerals refer to like elements. Therefore, bitcell 20 and transistor 46 are the same as described with respect to FIG. 2. The embodiment of FIG. 3, however, uses a reconfigured tracking cell 50 to provide a diode-connected transistor for source line biasing within source bias circuit 18. In this embodiment, source bias circuit 18 includes a plurality of reconfigured tracking cells in which one is coupled to each source line of array 14.

Reconfigured tracking cell 50 of FIG. 3, which is a part of source bias circuit 18, includes NMOS transistors 60, 54, 58, and 62, and PMOS transistors 52 and 56. First current electrodes of transistor 52 and transistor 56 are coupled to VSS. A second current electrode of transistor 52 is coupled to a control electrode of transistor 52, and a second current electrode of transistor 56 is coupled to a control electrode of transistor 56. The control electrodes of transistors 52 and 56 are coupled to receive the en signal. A first current electrode of transistor 60 is coupled to a control electrode of transistor 60 and to SLX. A second current electrode of transistor 60 is coupled to a first current electrode of transistor 54. A control electrode of transistor 54 is coupled to the control electrode of transistor 52, and a second current electrode of transistor 54 is coupled to VSS. A control electrode of transistor 62 is coupled to VSS. A second current electrode of transistor 62 is coupled to a first current electrode of transistor 58. A control electrode of transistor 58 is coupled to the control electrode of transistor 56, and a second current electrode of transistor 58 is coupled to VSS. The body terminals of transistors 60 and 62 are coupled to Vsuba, since the transistors of source bias circuit 18 are also formed in well 28.

In operation, during standby when source bias circuit 18 is enabled, srcbias_en_b is asserted to a logic level 0, as described above, and turns off transistor 46. Also, en is asserted to a logic level 1 which turns off transistors 52 and 56 and turns on transistors 54 and 58. In this situation, diode-connected transistor 60 (which may also be referred to as diode 60) is coupled between VSS and SLX, similar to diode-connected transistor 44 of FIG. 2 when source biasing is enabled by srcbias_en_b. Therefore, during standby, diode 60 provides a source bias voltage (vssa_bias) to SLX. Since diode 60 is also formed in well 28 with its body coupled to Vsuba (such as with a body tie), diode 60 tracks the well bias condition being applied to the transistors of array 14 within well 28. As in FIG. 2, in the embodiment of FIG. 3, the RBB does not change the characteristics of diode 60, and the source bias voltage is roughly independent of RBB. In this manner, the effect of RBB on leakage current is not degraded.

Still referring to FIG. 3, during normal operation, such as during read and write operations, srcbias_en_b is negated to a logic level 1, turning on transistor 46 and shorting reconfigured tracking cell 50, including diode 60. That is, during normal operation, diode 60 does not provided any source bias to SLX, and SLX is coupled to VSS via transistor 46. Also, during normal operation en is negated to a logic level 0. This turns off transistors 54 and 58.

Reconfigured tracking cell 50 may be similar to the tracking cells of tracking columns 16. In a tracking cell of tracking columns 16, 6 transistors are used which are similar to those of cell 50. However, in a tracking cell, the transistor in the position of transistor 60, rather than being diode-connected, has a first control electrode coupled to a dummy bit line and a control electrode coupled to a tracking control signal. The tracking cells of tracking columns 16 may include a similar configuration as a bitcell, with the same number, type, and size of transistors. As discussed above, these tracking cells may allow for self-timed operations within memory 10. For example, tracking cells can be statically pre-selected and then activated with the tracking control signal as needed to perform a self-timed operation, such as indicating when to enable the sense amplifiers based on the discharge of the dummy bit line.

In one embodiment, reconfigured tracking cells, such as reconfigured tracking cell 50, may be used within source bias circuit 18 since they are commonly available and integrated directly into the memory array. In some embodiments, such as in the embodiment of FIG. 1, both conventional tracking cells within tracking columns 16 and reconfigured tracking cells within source bias circuit 18 are used. That is, even though reconfigured tracking cells are used for the source bias circuit, separate conventional tracking cells (such as in tracking columns 16) may still be needed to enable self-timed operations.

By now it should be appreciated that there has been provided a source bias circuit for use with a memory array that allows the use of RBB without degrading leakage current reduction during standby. The use of a diode-connected transistor, whether it be on its own or part of a reconfigured tracking cell, that is formed or implemented in the same well (e.g. isolated well) as the memory array itself allows the diode-connected transistor to track the well bias applied to the array. This allows the source biasing to be more independent of the RBB as compared to conventional source biasing, and thus allows for a reduction in leakage current of the array.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name or a "b" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Some of the above embodiments, as applicable, may be implemented using a variety of different memory systems. For example, although FIG. 1 and the discussion thereof describe an exemplary memory system architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Also for example, in one embodiment, the illustrated elements of memory system 10 are circuitry located on a single integrated circuit or within a same device. System 10 may be alone on an integrated circuit or embedded within an integrated circuit having additional elements, such as a processor. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, different memory types or different bitcell configurations may be used in which the source bias circuit is still formed within the same well as the memory array itself. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a memory system includes an isolated first well of a first polarity; an array of volatile memory cells, each of the memory cells including a first set of transistors in the isolated first well, and a second set of transistors; a source bias circuit coupled to the array of volatile memory cells, at least a portion of the source bias circuit is in the isolated first well and coupled to source electrodes of the first set of transistors of each of the memory cells; and a control circuit configured to enable the source bias circuit. In one aspect of this embodiment, the at least a portion of the source bias circuit includes a diode-connected transistor coupled to the source electrodes of the first set of transistors. In a further aspect, the memory system further includes a source bias enable circuit which includes a second transistor coupled in parallel with the diode-connected transistor and between the source electrodes of the first set of transistors and a first supply voltage, the second transistor is outside the isolated first well and a gate electrode of the second transistor is coupled to a source bias enable signal. In another aspect, the first and second sets of transistors in the memory cells are configured as two cross-coupled inverters and two pass transistors. In another aspect, the memory system further includes a first column of tracking circuits coupled to the array of volatile memory cells. In a further aspect, the source bias circuit includes a second column of tracking cells coupled to the array of volatile memory cells. In yet a further aspect, a tracking cell in the second column of tracking cells includes a first set of transistors in the isolated first well and a second set of transistors, the first set of transistors in the tracking cell includes: a first transistor including a gate electrode and a first current electrode coupled to a source line; a second transistor including a first current electrode coupled to a second current electrode of the first transistor and a second current electrode coupled to a first supply voltage; a third transistor including a gate electrode and a first current electrode coupled to the first supply voltage; a fourth transistor including a first current electrode coupled to a second current electrode of the third transistor and a second current electrode coupled to the first supply voltage; the second set of transistors in the tracking cell includes: a fifth transistor including a first current electrode coupled to the first supply voltage, a second current electrode coupled to a respective gate electrode and a gate electrode of the second transistor; a sixth transistor including a first current electrode coupled to the first supply voltage, a second current electrode coupled to a respective gate electrode and a gate electrode of the fourth transistor. In even a further aspect, the gate electrodes of the second, fourth, fifth and sixth transistors are coupled to an enable signal from the control circuit. In yet an even further aspect, the memory system further includes a source bias enable circuit which includes a second transistor in the second well with a first current electrode coupled to the source line, a second current electrode coupled to the first supply voltage, and a gate electrode of the second transistor is coupled to a source bias enable signal. In another further aspect, body ties coupled to a substrate supply voltage for the first set of transistors of the volatile memory cells, the first set of transistors of the tracking cell in the second column of tracking cells, and the at least a portion of the source bias circuit.

In another embodiment, a memory system includes a substrate including a first well of a first polarity; a volatile memory cell including a first set of transistors in the first well and a second set of transistors, wherein the first and second set of transistors are configured as two pairs of cross-coupled inverters and two pass transistors coupled to the cross-coupled inverters; a source bias circuit coupled to transistors of the first set of transistors in the cross-coupled inverters, a portion of the source bias circuit is implemented in the first well; body ties of the first set of transistors and the portion of the source bias circuit are coupled to a substrate supply voltage. In one aspect of this another embodiment, the memory system further includes a control circuit configured to enable and disable the source bias circuit. In a further aspect, the source bias circuit includes a diode in the first well having a source electrode coupled to source electrodes of the transistors of the first set of transistors in the cross-coupled inverters, a drain electrode coupled to a first supply voltage, and a body tie coupled to the substrate supply voltage, and the memory system further includes an enable transistor outside the first well and coupled in parallel with the diode. In another aspect, the memory system further includes an array of memory cells that includes the volatile memory cell; a first column of tracking circuits coupled to the array of memory cells. In a further aspect, the source bias circuit includes a second column of tracking cells coupled to the array of memory cells. In yet a further aspect, the memory system further includes a tracking cell in the second column of tracking cells includes a first set of transistors in the first well and a second set of transistors, the first set of transistors in the tracking cell includes: a first transistor including a gate electrode and a first current electrode coupled to a source line; a second transistor including a first current electrode coupled to a second current electrode of the first transistor and a second current electrode coupled to a first supply voltage; a third transistor including a gate electrode and a first current electrode coupled to the first supply voltage; a fourth transistor including a first current electrode coupled to a second current electrode of the third transistor and a second current electrode coupled to the first supply voltage; the second set of transistors in the tracking cell includes: a fifth transistor including a first current electrode coupled to the first supply voltage, a second current electrode coupled to a respective gate electrode and a gate electrode of the second transistor; a sixth transistor including a first current electrode coupled to the first supply voltage, a second current electrode coupled to a respective gate electrode and a gate electrode of the fourth transistor. In yet a further aspect, the gate electrodes of the second, fourth, fifth and sixth transistors are configured to receive an enable signal.

In yet another embodiment, a method of operating a volatile memory system, includes applying a reverse back bias voltage to a first doped well in a substrate to retain data in memory cells in the volatile memory system, wherein each memory cell of the memory cells includes a first pair of transistors configured as a first inverter cross-coupled to a second pair of transistors configured as a second inverter, a first pass transistor coupled to the first pair of transistors, a second pass transistor coupled to the second pair of transistors, first transistors of the first and second inverters and the first and second pass transistors are implemented in the first doped well, second transistors of the first and second inverters are implemented in a second doped well in the substrate, and the memory system includes a source bias circuit coupled to the memory cells, and at least a portion of the source bias circuit is implemented in the first doped well, and body ties of the first transistors of the first and second inverters, the first and second pass transistors, and the at least a portion of the source bias circuit are coupled to the reverse back bias voltage. In one aspect, the method further includes placing an enabling transistor in non-conductive mode to apply the reverse back bias voltage to the first doped well, wherein the enabling transistor is coupled in parallel with the at least a portion of the source bias circuit. In a further aspect, the at least a portion of the source bias circuit is a diode. In another aspect, the at least a portion of the source bias circuit is a tracking cell.

What is claimed is:

1. A memory system comprising:
an isolated first well of a first polarity;
an array of volatile memory cells, each of the memory cells including a first set of transistors in the isolated first well, and a second set of transistors;
a source bias circuit coupled to the array of volatile memory cells, at least a portion of the source bias circuit is in the isolated first well and coupled to source electrodes of the first set of transistors of each of the memory cells; and a control circuit configured to enable the source bias circuit.

2. The memory system of claim 1, wherein:
the at least a portion of the source bias circuit includes a diode-connected transistor coupled to the source electrodes of the first set of transistors.

3. The memory system of claim 2 further comprising:
a source bias enable circuit which includes a second transistor coupled in parallel with the diode-connected transistor and between the source electrodes of the first set of transistors and a first supply voltage, the second transistor is outside the isolated first well and a gate electrode of the second transistor is coupled to a source bias enable signal.

4. The memory system of claim 1 wherein:
the first and second sets of transistors in the memory cells are configured as two cross-coupled inverters and two pass transistors.

5. The memory system of claim 1 further comprising:
a first column of tracking circuits coupled to the array of volatile memory cells.

6. The memory system of claim 5 wherein:
the source bias circuit includes a second column of tracking cells coupled to the array of volatile memory cells.

7. The memory system of claim 6 wherein:
a tracking cell in the second column of tracking cells includes a first set of transistors in the isolated first well and a second set of transistors, the first set of transistors in the tracking cell includes:
a first transistor including a gate electrode and a first current electrode coupled to a source line;
a second transistor including a first current electrode coupled to a second current electrode of the first transistor and a second current electrode coupled to a first supply voltage;
a third transistor including a gate electrode coupled to the first supply voltage and a first current electrode;
a fourth transistor including a first current electrode coupled to a second current electrode of the third transistor and a second current electrode coupled to the first supply voltage;
the second set of transistors in the tracking cell includes:
a fifth transistor including a first current electrode coupled to the first supply voltage, a second current electrode coupled to a respective gate electrode and a gate electrode of the second transistor;
a sixth transistor including a first current electrode coupled to the first supply voltage, a second current electrode coupled to a respective gate electrode and a gate electrode of the fourth transistor.

8. The memory system of claim 7 wherein the gate electrodes of the second, fourth, fifth and sixth transistors are coupled to an enable signal from the control circuit.

9. The memory system of claim 8 further comprising:
a source bias enable circuit which includes a second transistor in the second well with a first current electrode coupled to the source line, a second current electrode coupled to the first supply voltage, and a gate electrode of the second transistor is coupled to a source bias enable signal.

10. The memory system of claim 8 wherein :
body ties coupled to a substrate supply voltage for the first set of transistors of the volatile memory cells, the first set of transistors of the tracking cell in the second column of tracking cells, and the at least a portion of the source bias circuit.

11. The memory system of claim 4, wherein the source bias circuit includes a diode in the isolated first well having a source electrode coupled to the source electrodes of the transistors of the first set of transistors in the two cross-coupled inverters, a drain electrode coupled to a first supply voltage, and a body tie coupled to a substrate supply voltage.

12. The memory system of claim 11, further comprising:
an enable transistor outside the first well and coupled in parallel with the diode.

13. The memory system of claim 11, wherein the diode comprises a diode-connected transistor.

14. The memory system of claim 4, wherein body ties of the first set of transistors are coupled to a substrate supply voltage.

15. The memory system of claim 11, wherein body ties of the first set of transistors are coupled to the substrate supply voltage.

16. The memory system of claim 3, wherein body ties of the first set of transistors and the diode-connected transistor are coupled to a substrate supply voltage.

17. The memory system of claim 2, wherein body ties of the first set of transistors and the diode-connected transistor are coupled to a substrate supply voltage.

18. The memory system of claim 2, wherein the diode-connected transistor is in the isolated first well and has a source electrode coupled to the source electrodes of a plurality of transistors of the first set of transistors, a drain electrode coupled to a first supply voltage, and a body tie coupled to a substrate supply voltage.

19. The memory system of claim 18, further comprising:
an enable transistor outside the first well and coupled in parallel with the diode-connected transistor.

* * * * *